US011310002B2

(12) United States Patent
Imanilov

(10) Patent No.: US 11,310,002 B2
(45) Date of Patent: Apr. 19, 2022

(54) INTERFERENCE MITIGATION FOR SENSOR PANEL

(71) Applicant: Microsoft Technology Licensing, LLC, Redmond, WA (US)

(72) Inventor: Benjamin Imanilov, Hod Hasharon (IL)

(73) Assignee: Microsoft Technology Licensing, LLC, Redmond, WA (US)

( * ) Notice: Subject to any disclaimer, the term of this patent is extended or adjusted under 35 U.S.C. 154(b) by 47 days.

(21) Appl. No.: 15/449,956

(22) Filed: Mar. 4, 2017

(65) Prior Publication Data

US 2018/0253185 A1  Sep. 6, 2018

(51) Int. Cl.
| | |
|---|---|
| *H04L 5/00* | (2006.01) |
| *H03K 17/96* | (2006.01) |
| *H04L 27/26* | (2006.01) |
| *G06F 3/041* | (2006.01) |
| *G06F 3/044* | (2006.01) |
| *G06F 17/15* | (2006.01) |
| *G06F 17/14* | (2006.01) |
| *H04N 1/32* | (2006.01) |

(52) U.S. Cl.
CPC .......... *H04L 5/0021* (2013.01); *G06F 3/0446* (2019.05); *G06F 3/04166* (2019.05); *G06F 3/04182* (2019.05); *H03K 17/9622* (2013.01); *H04L 27/2614* (2013.01); *H04L 27/2615* (2013.01); *H04L 27/2634* (2013.01); *G06F 17/145* (2013.01); *G06F 17/156* (2013.01); *H04N 1/32176* (2013.01)

(58) Field of Classification Search
CPC ........... G06G 7/1942; H04N 1/322176; H04N 1/3217; H04N 1/32176; H04L 5/0021; H04L 27/2614; H04L 27/2615; H04L 27/2634; G06F 3/04166; G06F 3/04182; G06F 3/0446; G06F 17/156; G06F 17/145; G06F 3/0442; H03K 17/9622
See application file for complete search history.

(56) References Cited

U.S. PATENT DOCUMENTS

| | | | |
|---|---|---|---|
| 5,271,038 A * | 12/1993 | Cai ...................... | H04B 1/1027 327/309 |
| 8,605,054 B2 | 12/2013 | Krenik et al. | |
| 8,837,613 B2 | 9/2014 | Petrov et al. | |
| 8,970,544 B1 | 3/2015 | Mohindra | |

(Continued)

OTHER PUBLICATIONS

Kim, PAPR Reduction of the OFDM Signal by the SLM-based WHT and DSI Method, TENCON 2006-2006 IEEE Region 10 Conference (Year: 2006).*

Al-Mawali, et al., "Joint Time-domain/Frequency-domain Impulsive Noise Reduction in OFDM-based Power Line Communications", In Journal of IEEE Telecommunication Networks and Applications Conference, Dec. 7, 2008, pp. 138-142.

(Continued)

*Primary Examiner* — Patrick N Edouard
*Assistant Examiner* — Douglas M Wilson

(57) ABSTRACT

An electronic device is described which has a sensor panel comprising a plurality of receive electrodes configured to measure signals received from one or more transmit electrodes. The device has a sensor panel control module configured to: receive signals from the plurality of receive electrodes in the presence of at least one tone interferer. The module is configured to convert the received signals from a time domain into a frequency domain; and to process the received signals in the frequency domain in order to mitigate the effect of the tone interferer.

20 Claims, 5 Drawing Sheets

(56) References Cited

U.S. PATENT DOCUMENTS

| | | | |
|---|---|---|---|
| 8,982,091 | B1 | 3/2015 | Mohindra |
| 9,231,808 | B1 | 1/2016 | Wilson et al. |
| 9,379,768 | B2 | 6/2016 | Moffatt et al. |
| 2004/0203551 | A1* | 10/2004 | Li .................... H03G 3/345 455/296 |
| 2012/0056841 | A1* | 3/2012 | Krenik ............ G06F 3/0446 345/174 |
| 2013/0242930 | A1 | 9/2013 | Takahashi et al. |
| 2014/0327644 | A1* | 11/2014 | Mohindra .......... G06F 3/04182 345/174 |
| 2015/0109212 | A1 | 4/2015 | Kao et al. |
| 2015/0301651 | A1 | 10/2015 | Leigh et al. |
| 2016/0117051 | A1* | 4/2016 | Han .................. G06F 3/04166 345/173 |
| 2016/0231854 | A1 | 8/2016 | Koo |
| 2018/0074641 | A1* | 3/2018 | Tanaka ................. G06F 3/044 |

OTHER PUBLICATIONS

Li, et al., "MIMO-OFDM systems based on space-time coding and OFDM carrier block spreading", In Proceedings of 6th International Conference on Information, Communications & Signal Processing,, Dec. 10, 2007, 3 pages.

Mohamed, et al., "Frequency Selection Concurrent Sensing Technique for High-Performance Touch Screens", In Journal of Display Technology, vol. 12, Issue 11, Nov. 12, 2016, 1 pages.

Ko, et al., "A 70dB SNR capacitive touch screen panel readout IC using capacitor-less trans-impedance amplifier and coded Orthogonal Frequency-Division Multiple Sensing scheme", In Proceedings of Symposium on VLSI Circuits, Jun. 12, 2013, 3 pages.

Mohamed, et al., "OFDM and TDM based sensing method for large projected mutual-capacitance touch screens", In Proceedings of IEEE International Conference on Consumer Electronics, Jan. 7, 2016, 3 pages.

* cited by examiner

INTERFERENCE MITIGATION FOR SENSOR PANEL

BACKGROUND

Electronic devices such as tablet computers, smart phones, smart watches and others often incorporate a sensor panel to display information and to receive one or more user inputs made by touching the display. The sensor panel is typically a mutual capacitance sensor panel with a capacitive sensing medium incorporating a plurality of row electrodes (referred to as transmit electrodes) and a plurality of column electrodes (referred to as receive electrodes) arranged in a rectangular grid pattern. A drive signal voltage is applied on the transmit electrodes and a voltage is measured at each receive electrode. Since the human body is an electrical conductor, when a finger touches or comes close to the sensor panel, an electrostatic field of the sensor panel is distorted and this produces a measurable change at the receive electrodes.

Coordinates of the user input at the sensor panel are computed from the measured change and interpolation may be used to compute coordinates of user input positions within individual cells of the grid rather than at intersections of the grid.

Where a stylus or pen is used in conjunction with the sensor panel, the stylus or pen incorporates drive electrodes so that drive electrodes at the sensor panel itself may be used as receive electrodes.

Existing sensor panels have difficulty coping with impulse interference and/or tone interferers. Impulse interference occurs when energy of a relatively high intensity and short duration flows into the sensor panel, such as from electrostatic charge flowing from a user's body, or from nearby electronic equipment. Tone interference occurs when noise detriments a particular tone from a plurality of tones used to communicate between electrodes of the sensor panel and a control module, without significantly affecting the other tones.

The embodiments described below are not limited to implementations which solve any or all of the disadvantages of known sensor panels or sensor panel control modules.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

An electronic device is described which has a sensor panel comprising a plurality of receive electrodes configured to measure signals received from one or more transmit electrodes. The device has a sensor panel control module configured to receive signals from the plurality of receive electrodes in the presence of at least one tone interferer. The module is configured to convert the received signals from a time domain into a frequency domain; and to process the received signals in the frequency domain in order to mitigate the effect of the tone interferer.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
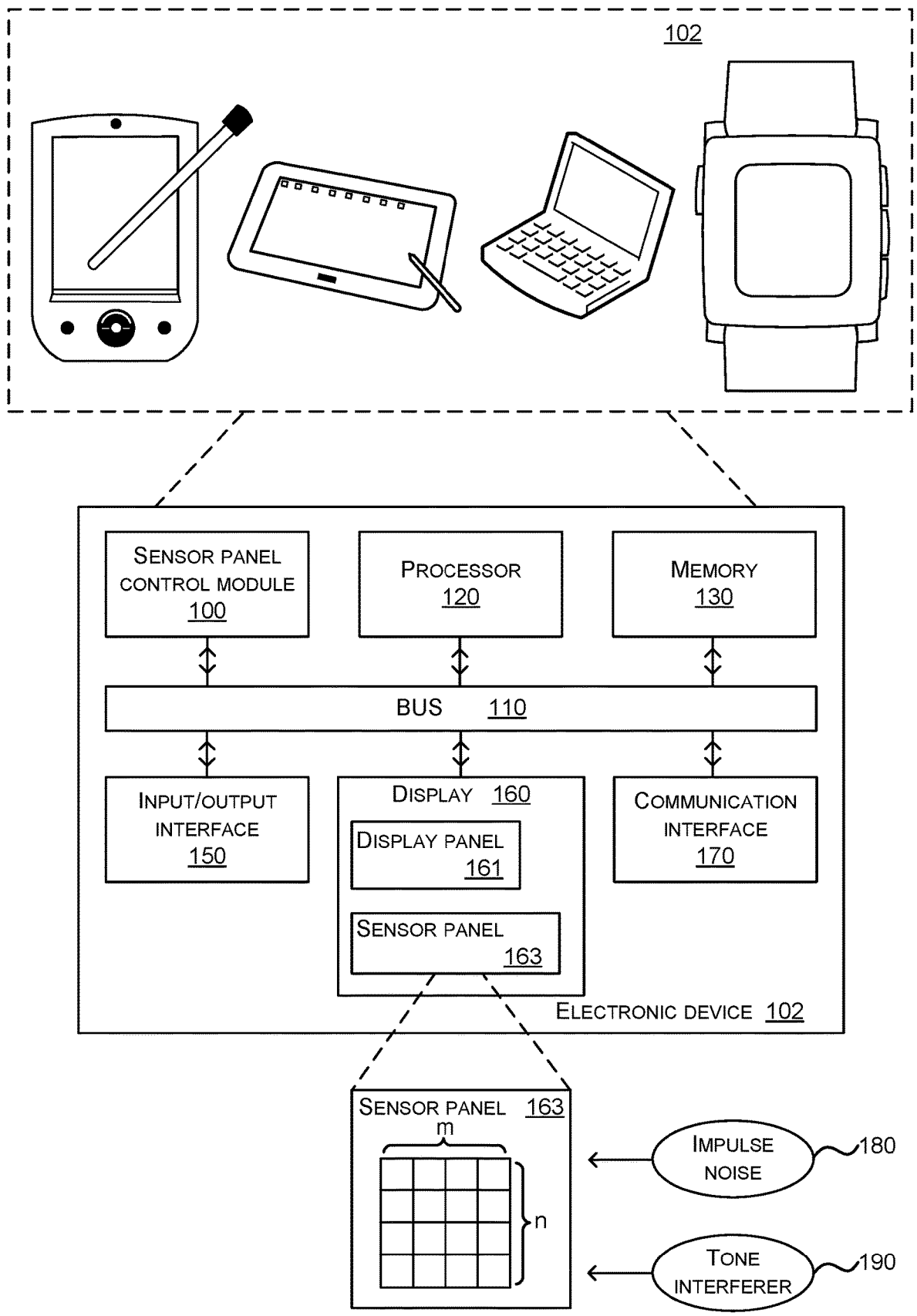
FIG. 1 is a schematic diagram of an electronic device with a touch sensor panel and a sensor panel control module which is experiencing impulse noise and tone interferer.

The detailed description provided below in connection with the appended drawings is intended as a description of the present examples and is not intended to represent the only forms in which the present example are constructed or utilized. The description sets forth the functions of the example and the sequence of operations for constructing and operating the example. However, the same or equivalent functions and sequences may be accomplished by different examples.

Impulse noise in the context of sensor panels occurs when energy of a relatively high intensity and short duration flows into the sensor panel. The energy comes from a variety of different sources, such as a human user or electronic apparatus in proximity of the sensor panel. When a human user, whose body carries electrostatic charge, comes into proximity with a sensor panel the electrostatic charge from the user's body flows into the sensor panel and causes impulse noise. When a liquid crystal display in proximity to a sensor panel is powered on or off there can be a surge in energy which dissipates into the sensor panel causing impulse noise. Another source of impulse noise is a power supply that is based on pulse width modulation, or a power line network where other devices introduce noise. In some cases the short impulses of energy are modulated so that they have tone characteristics and act as both tone interferers and impulse noise. Impulse noise is particularly problematic in the case of sensor panel technology because it severely detriments the ability of the sensor panel to accurately detect position of touch input at the sensor panel. For example, impulse noise is wrongly detected as touch input in situations where the user is in fact, not making any touch input. In other cases, impulse noise occurs during touch input and results in inaccurate touch input positions being computed by the sensor panel, or invalid results (such as impossible values). For sensor systems which use a stylus or pen, impulse noise is often transmitted through the human body and drastically reduces the detection accuracy.

A tone interferer is an instance of noise which impacts a particular tone of a plurality of tones used to estimate touch position, estimate stylus/pen position and detect/decode informative data signals sent by a pen/stylus to the sensor panel system. The tone interferer does not significantly impact the other tones. However, a tone interferer is sometimes mistaken as a signal sent as part of the touch sensing technology. A tone interferer arises in practice from a variety of potential sources including the sources mentioned above in respect of impulse noise. That is, an impulse noise event can be a tone interferer in some cases. However, typically an impulse noise event gives rise to noise in a plurality of tones.

Previous approaches to mitigating impulse noise in the context of power line communication have involved clipping, blanking and (clipping and blanking). These operations comprise reducing amplitudes of signal samples according to thresholds, and/or setting amplitudes of signal samples to zero according to thresholds. However, those approaches designed for digital communication cause degradation in the quality of estimated signals in the case the thresholds are set aggressively. Relaxing thresholds in case of touch sensing systems technology causes missing of the impulse noise events. Therefore, those techniques have disadvantages for medium and low impulsive noise situations that are typically acceptable for digital communication, but which are critically unacceptable for touch sensing systems.

More advanced approaches to mitigating tone interferer impact that include error correction elements are highly complex and introduce significant delay which is not practical for touch panel sensing technology.

In various examples described herein, methods of mitigating tone interference in the context of sensor panels are disclosed which use clipping or blanking (or clipping with blanking) in the frequency domain.

In some examples, impulse noise is also reduced by using clipping or blanking (or clipping with blanking) in the time domain.

In the present document the term "touch input" is used to refer to direct contact by an input medium (such as a finger-tip or stylus/pen) with a sensor panel and also to input events where an input medium comes into close physical proximity to the sensor panel whereby a change in capacitance is detectable at a position on the sensor panel.

The examples described herein use sensor panel technology where a Hadamard orthogonal frequency division multiplexing (OFDM) scheme is used to drive the sensor panel and to receive signals from the sensor panel. However, this is not essential as the present technology is operable for any type of sensor panel technology where information about the received signal, as it is expected to be in the absence of impulse noise, is known and/or predictable. For example, Time Division Single or Multiple carrier, Frequency Division, Orthogonal Frequency Division, Code Division or a combination of one or more of these may be used.

FIG. 1 is a schematic diagram of an electronic device 102 with a touch sensor panel 163 (referred to as a sensor panel herein for brevity) and a sensor panel control module 100. The sensor panel 163 receives impulse noise 180 and tone interferer(s) 190 such as from a nearby liquid crystal display or other nearby electronics, or from electrostatic charge from a user's body. The sensor panel control module 100 has circuitry to mitigate the impulse noise 180 and/or tone interferer(s) 190 as described in more detail later in this document.

The electronic device 102 is a smart phone, tablet computer, laptop computer, smart watch or any other type of electronic device with a sensor panel 163. The electronic device has at least one processor 120, a memory 130, a communication interface 170 such as a radio communications transceiver, a network card, or any other communication interface for enabling wired or wireless communications with other computing entities. The electronic device has an input/output interface 150 for controlling outputs from the electronic device and for controlling inputs received at the electronic device. The electronic device, in some cases, has a display 160 although this is not essential. The display comprises a display panel 161 which may be located in front of or behind the sensor panel 163 such as in a conventional smart phone, tablet computer, or smart watch. In some cases the sensor panel 163 is a touch pad which is located remote from the display panel 161 as in the case of a laptop computer such as that illustrated in FIG. 1. A bus 110 connects various of the components of the electronic device 102 such as the sensor panel control module 100, the processor 120, the memory 130, the input/output interface 150, the display 160 and the communication interface 170. In the example of FIG. 1 the sensor panel 163 is shown as part of the display 160 but this is not essential as mentioned above.

The sensor panel 163 comprises a first array of electrodes (m in FIG. 1) arranged substantially parallel with one another and a second array of electrodes (n in FIG. 1) arranged substantially parallel with one another. In some implementations the electrodes in the first array are row electrodes positioned substantially perpendicular to the electrodes in the second array (column electrodes) to form a grid or matrix. While the row electrodes may be referred to as transmit electrodes and the column electrodes may be referred to as receive electrodes, these designations may be reversed with no change in meaning. However, it is not essential for the electrodes to be arranged in a grid. In some cases the row electrodes intersect each column electrode at an angle that is not perpendicular thereby forming a sensor having the form of a parallelogram. In some cases the electrodes form a more complex pattern in which any two rows or columns are not necessarily parallel, or not necessarily laid out along straight lines.

Where the sensor panel is used in front of or within a display (such as a liquid crystal display) the sensor panel 163 is substantially transparent to visible wavelengths of light. Specifically, the electrodes in the sensor panel are made from transparent conductive material (for example, indium tin oxide), or alternatively, are made from opaque material but with traces so small as to be inconspicuous). In other implementations, the sensor panel is not positioned within, in front or behind a display but rather is positioned within a touch pad distinct from the display of the electronic device.

The sensor panel 163 is used to measure the capacitance from each row to each column of the electrodes in order to measure the position of an input medium such as a finger, or stylus. As shown in FIG. 1 the electronic device 102 has an associated stylus in some cases but it is not essential to use a stylus.

Figure 2:
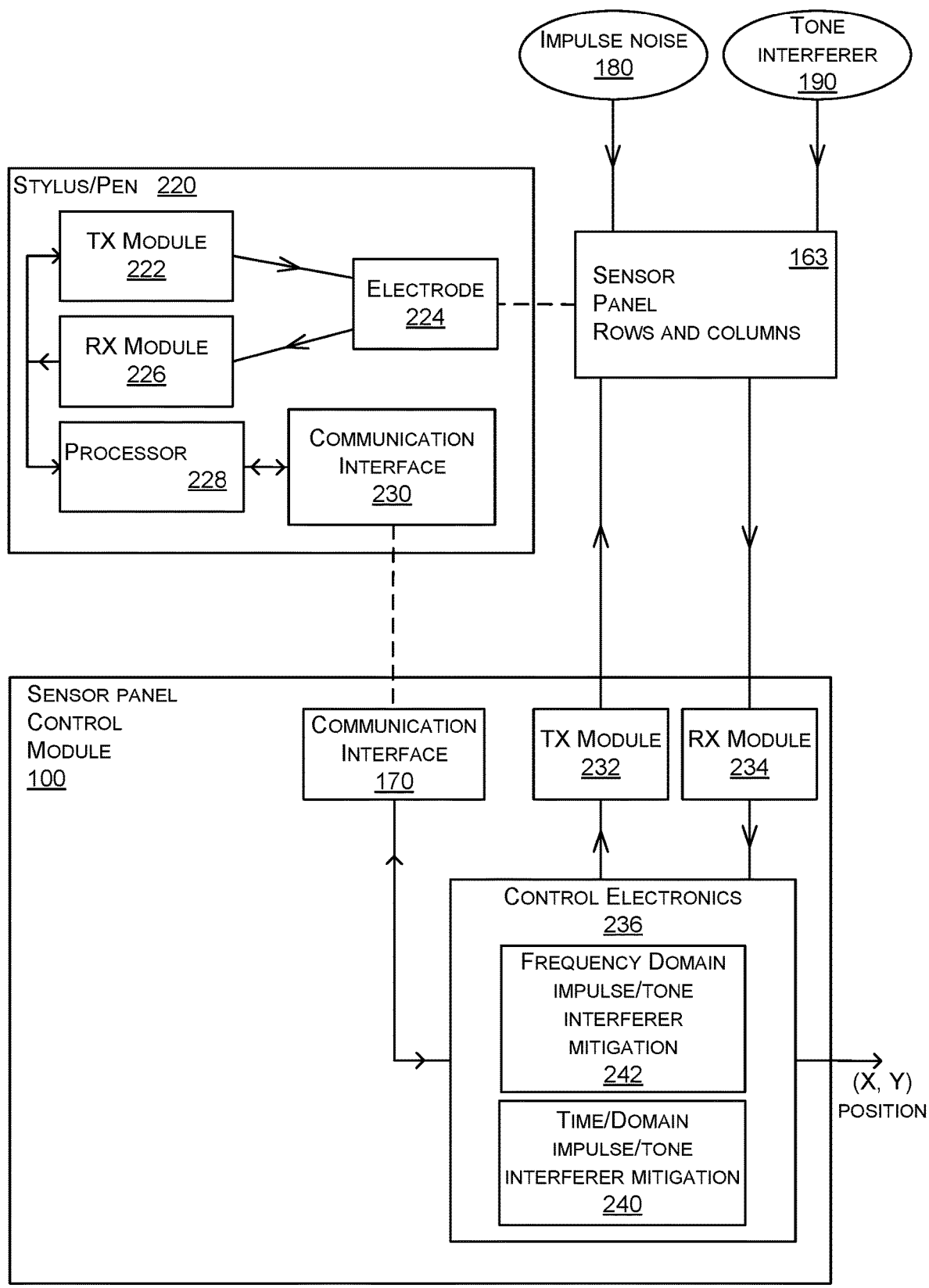
FIG. 2 is a schematic diagram of the sensor panel and sensor panel control module of FIG. 1 in more detail and with an optional stylus.

FIG. 2 is a schematic diagram of a stylus or pen 220 together with a sensor panel 163 and a sensor panel control module 100. The sensor panel control module 100 is the sensor panel control module of FIG. 1 with more detail shown. The stylus 220 may be omitted from FIG. 2 in examples where no stylus is used. The sensor panel 163 is a capacitive sensor panel such as that described with reference to FIG. 1.

The stylus 220 includes a transmit module 222 and a receive module 226 in the example of FIG. 2. However, in some implementations the stylus does not include one or both of the transmit module 222 and the receive module 226. The stylus has a body approximately the size and shape of a pen or pencil having a tip in which is positioned a stylus electrode 224. The stylus has a processor 228 for controlling the transmit and receive modules 222, 226 in the stylus 220. In some cases the stylus has a memory (not shown).

The tip of the stylus is made of electrically conductive material. For example, it is made from metal wire or foil or machined from solid metal stock. In some examples the stylus has a tapered tip.

The sensor panel control module 100 comprises a transmit module 232 and a receive module 234. The transmit modules and receive modules of the stylus and the sensor panel control module 100 comprise analog circuitry and circuitry for converting between analog and digital signals. The analog circuitry of the transmit and receive modules includes circuitry wired to the electrode of the stylus and/or the electrodes of the sensor panel. The analog transmit circuitry is configured to transmit a voltage to the electrodes of the sensor panel electrostatically by applying a time-varying voltage to the tip of the stylus and/or to the transmit electrodes of the sensor panel.

The analog receive circuitry of the stylus is configured to receive and measure a time-varying current from the conductors of the sensor panel electrostatically by maintaining the tip at a constant (i.e. a non-time-varying) voltage and measuring the current in to the tip. A processor 228 in the stylus 220 may sequence these operations and use communication interface 230 such as a wireless transmitter or transceiver to wirelessly communication with the sensor panel control module. In other examples the stylus 220 has a wired connection to the sensor panel control module.

The analog receive circuitry of the sensor panel control module 100 is configured to receive and measure a time-varying current from the conductors of the sensor panel electrostatically. The analog receive circuitry comprises an analog to digital converter.

The control electronics 236 comprises circuitry for converting from a time domain to a frequency domain and circuitry for converting from a frequency domain to a time domain. In some examples the control electronics comprises circuitry for computing Hadamard matrix transformations and inverse Hadamard matrix transformations but this is not essential. In addition the control electronics 236 is configured to compute a position of any touch detected by the sensor panel.

The control electronics 236 comprises a time domain impulse noise reducer 240 and an optional frequency domain impulse noise reducer 242. The time domain impulse noise reducer comprises circuitry to carry out the method of operations 308 to 316 of FIG. 3 as explained in more detail below. The frequency domain impulse noise reducer is optional and comprises circuitry to carry out the operations of FIG. 4 as explained in more detail below.

Figure 3:
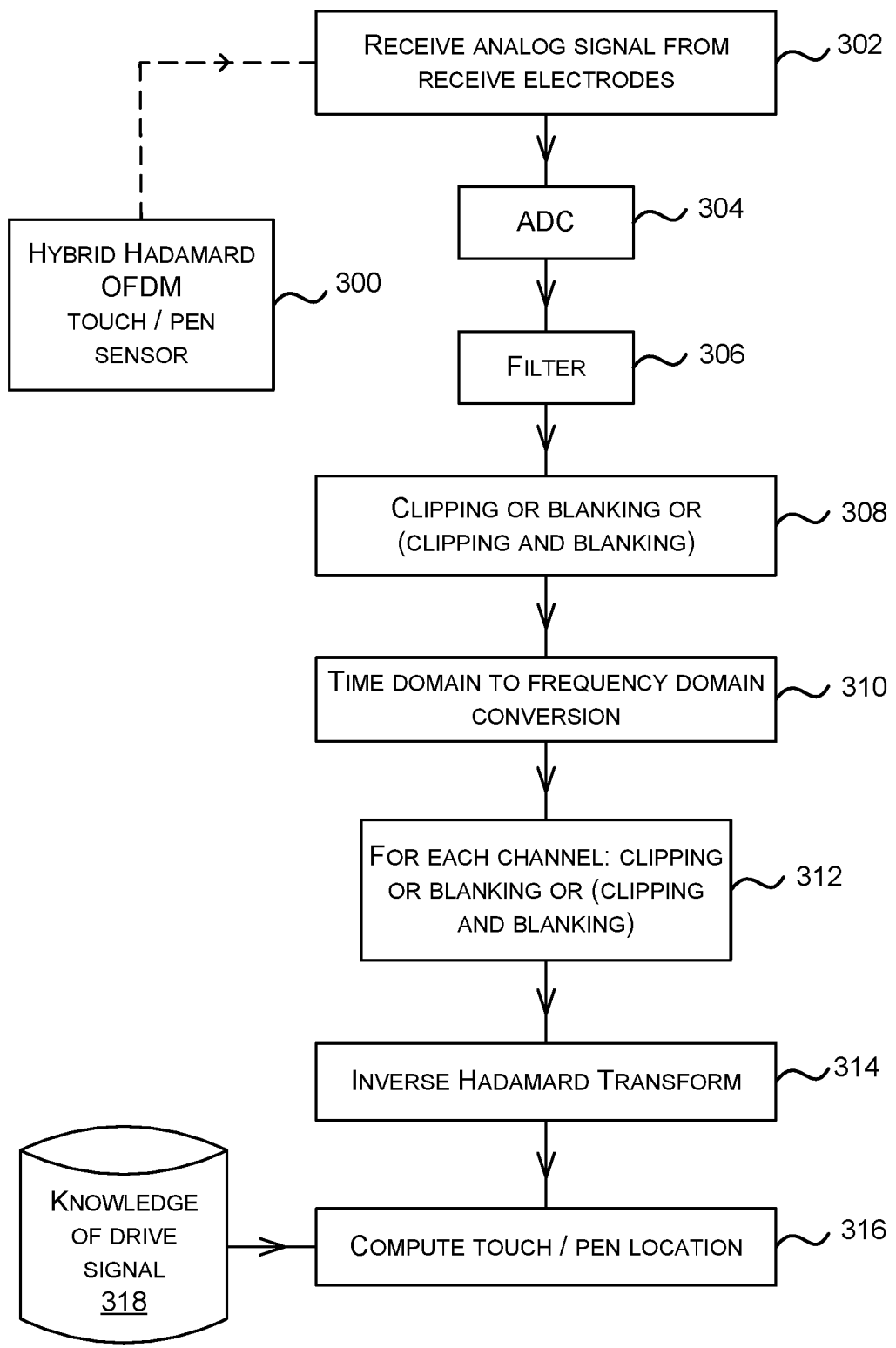
FIG. 3 is a flow diagram of a method of operating the sensor panel control module and/or stylus of FIG. 2 to receive and process signals from receive electrodes of a sensor panel and/or stylus in order to reduce impulse noise and/or tone interferer impact.

With reference to FIG. 3 a method of operation at the sensor panel control module 100 is described, regarding a receive stage where sensed signals are received at receive electrodes of the sensor panel 163. In some cases the receive electrodes are part of a hybrid Hadamard OFDM touch or pen sensor system 300 as described in detail below. However, this is not essential as the receive electrodes may be part of any sensor panel technology.

An analog signal is received 302 from each receive electrode of the sensor panel. This may be achieved by scanning the receive electrodes sequentially or in other ways. Each analog signal is converted 304 to a digital signal using any well-known or future analog to digital converter. The digital signals are optionally filtered 306 in some cases such as by filtering with a band pass filter to remove out of band noise and interference.

At the end of operation 306 the digital signals are in the time domain. In order to reduce impulse noise the signals in the time domain from the receive electrodes are optionally processed by operation 308 which carries out clipping or blanking or (clipping with blanking). Any suitable known clipping, blanking or clipping with blanking process may be used and examples are now given.

The process of clipping uses a clipping threshold denoted $T_c$. In the present technology the clipping threshold is found empirically or is preconfigured by an operator. The result of the clipping process is a signal sample y of one of the receive electrodes at time k, denoted $y_k$ and is formally expressed as:

$y_k = r_k$ if $|r_k| \leq T_c$ $y_k = f(T_c)p$ if $|r_k| > T_c$

Where p is a function of the received and expected phase $g(\arg(r_k), r_{k-M}, \ldots, r_{k-2}, r_{k-1}, r_{k+1}, r_{k+2}, \ldots, r_{k+L})$ that in some cases is $g(\arg(r_k)) = e^{j \arg(rk)}$. $T_c$ is the clipping threshold, $f(T_c, r_{k-M}, \ldots, r_{k-2}, r_{k-1}, r_{k+1}, r_{k+2}, \ldots, r_{k+L})$ is a function of $T_c$ and samples before and after k, in some cases give $f(T_c) = T_c$, L and M are the number of samples after and before the clipping sample. This means that the outgoing signal sample is set to the incoming signal sample $r_k$ in the case that the magnitude of the incoming signal sample is less than or equal to the clipping threshold. Also, the outgoing signal sample is set to the clipping threshold times $e^{j \arg(rk)}$ if the magnitude of the incoming signal sample is greater than the clipping threshold. The multiplication by $e^{j \arg(rk)}$ is according to the phase of the received sample at its baseband representation calculated according to the received sample.

The process of blanking uses a blanking threshold $T_b$ which in this technology is determined empirically or set by an operator. The result of the blanking process is a signal sample y of one of the receive electrodes at time k, denoted $y_k$ and is formally expressed as:

$y_k = r_k$ if $|r_k| \leq T_b$ $y_k = 0$ if $|r_k| > T_b$

Where $T_b$ is the blanking threshold. This means that the outgoing signal sample is set to the magnitude of the incoming signal sample $r_k$ in the case that the incoming signal sample is less than or equal to the blanking threshold. Also, the outgoing signal sample is set to zero if the magnitude of the incoming signal sample is greater than the blanking threshold.

The process of clipping with blanking uses two thresholds T1 and T2 which are determined empirically or set by an operator. The result of the blanking process is a signal sample y of one of the receive electrodes at time k, denoted $y_k$ and is formally expressed as:

$y_k = r_k$ if $|r_k| \leq T_1$ $y_k = f(T_c)p$ if $T_1 < |r_k| < T_2$ $y_k = 0$ if $|r_k| > T_2$ Where p is a function of the received and expected phase $g(\arg(r_k), r_{k-M}, \ldots, r_{k-2}, r_{k-1}, r_{k+1}, r_{k+2}, \ldots, r_{k+L})$ that in some cases is $g(\arg(r_k)) = e^{j \arg(rk)}$. $T_1$ is the clipping threshold, $f(T_1, r_{k-M}, \ldots, r_{k-2}, r_{k-1}, r_{k+1}, r_{k+2}, \ldots, r_{k+L})$ is a function of $T_1$ and samples before and after k, may be $f(T_1) = T_1$. L and M are the number of samples after and before the clipping sample. This means that the outgoing signal sample is set to the magnitude of the incoming signal sample $r_k$ in the case that the incoming signal sample is less than or equal to the first threshold. Also, the outgoing signal sample is set to the first threshold times $e^{jarg(rk)}$ if the incoming signal sample has a magnitude between the two thresholds. Also, the outgoing signal sample is set to zero if the magnitude of the incoming signal sample is greater than or equal to the second threshold.

Operations 308 are carried out by the time domain impulse noise reducer circuitry 240.

A time domain to frequency domain conversion 310 is then carried out for each receive electrode signal by carrying out a fast Fourier transform, a discrete cosine transform, or other time domain to frequency domain conversion process. The time domain to frequency domain conversion 310 uses one time domain to frequency domain converter correlated to each subcarrier signal.

This gives, for each receive electrode, a vector built from complex values representing amplitude and phase of each subcarrier signal received at that receive electrode.

The frequency domain impulse/tone interferer mitigation circuitry 242 carries out processes 312 which include, for each channel (subcarrier signal frequency), clipping or blanking or (clipping and blanking). The thresholds used by these processes are found empirically or are set by an operator. Any suitable clipping, blanking or (clipping with blanking) processes are used such as those mentioned above for the time domain.

In the case that Hadamard OFDM is being used, an inverse of the Hadamard matrix is then applied 314. The inverse Hadamard matrix is stored at memory 130. The inverse Hadamard matrix operation separates out the parts of the received signal which arise from signals transmitted on different transmit electrodes. Operation 314 is omitted in cases where Hadamard matrix transformation is not used.

The frequency domain signals are used to compute a touch or pen location 316 on the sensor panel using knowledge of the drive signal. This is done by comparing the drive signals and the received signals and interpolating a position between one or more of the electrodes at which the touch or pen input is inferred to occur.

More detail about the operations at box 312 of FIG. 3 is now given for the particular case where the sensor panel control module uses OFDM with Hadamard matrix transformation to communicate with the electrodes.

For a non-touch case the outputs of N time domain to frequency domain converters will be zero for all except one frequency, where the expected amplitude is [sqrt(N)*T/2] where T is a time interval during which the transmit electrodes are driven and where sqrt denotes square root. After multiplication by the Hadamard Matrix, all output amplitude values will be (sqrt(N))*(T/2). The immediately following explanation omits the (T/2) to give shorter mathematical expressions for simplicity.

Suppose only one transmit electrode was touched with "ro" reducing effect, for example for ro=20% of the transmitted signal at the relevant electrode. The calculated Hadamard Matrix multiplication output is (sqrt(N))*(1−ro)=0.8*sqrt(N).

All non-touch "zeroed" time domain to frequency domain converters give output signals with amplitudes equal to [ro/sqrt(N)]. The non-touch non-zero [sqrt(N)] time domain to frequency domain converter gives a signal with amplitude [(N−1)/sqrt(N)+(1−ro)/sqrt(N)]=sqrt(N)−ro/sqrt(N).

After Hadamard Matrix multiplication, all values of the amplitudes will be [sqrt(N)] except for the touched electrode which gives an amplitude of

[sqrt(N)−ro*sqrt(N)]=sqrt(N)*(1−ro).

Consider a situation when a tone interferer is present in one of the frequencies. This means that the clipping threshold and/or blanking threshold is crossed and so the process of box 312 is used to clip and/or blank the signal samples affected by the tone interferer.

In some examples, the clipping threshold and/or blanking threshold, used for the signal which is not zeroed by self-cancellation is computed as a constant bias value applied to the expected signal amplitude. This is found to improve quality of the results.

In the case of regular OFDM, rather than OFDM with Hadamard matrix transformation, the damage caused by the tone interferer is potentially irretrievable and results in failed operation of the sensor panel. This is because in regular OFDM there is no spreading of one transmit electrode signal over all of the subcarriers so that failure of a single subcarrier signal estimation results in potential failure of a transmit electrode intersection with all receive electrodes estimation. This is very detrimental as in a touch sensing system the worst case electrode detection defines the quality of the whole system.

The following example shows the level of mitigation of the tone interferer.

In the case of a tone interferer which results in crossing of the "blanking" threshold, the damaged time domain to frequency domain converter output will be zeroed, therefore after multiplication by Hadamard Matrix (operation 314) the touched antenna has an amplitude of:

[sqrt(N)−ro*(N−1)/sqrt(N)]=sqrt(N)−ro*sqrt(N)+ro/sqrt(N) instead of the expected amplitude of
[sqrt(N)−ro*sqrt(N)].

Roughly we could say there is a signal to noise ratio (SNR) of:

SNR=20*log 10(ro*sqrt(N)/(ro/sqrt(N)))=20*log 10(N)

This represents a significant improvement as compared with total damage of the sensing signal in the case of regular OFDM used in a touch system.

The "leakage" of the touched antenna into the non-touched antennas is also expressed using the same SNR of 20*log 10(N).

By this simplified example, it is shown that independent of the interferer tone energy, the residual damage is proportional to SNR=20*log 10(N), i.e. as more subcarrier frequencies are used to spread the transmitted signal the more the residual error reduces.

Figure 4:
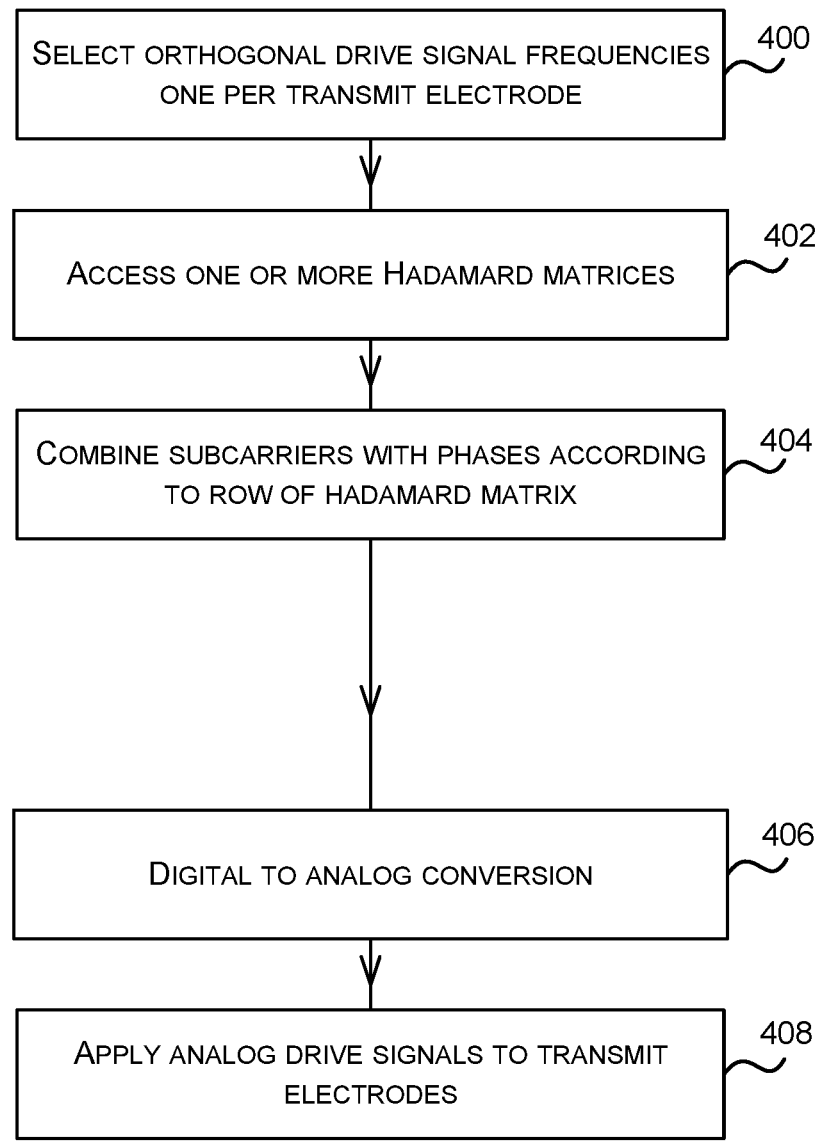
FIG. 4 is a flow diagram of a method of operating the sensor panel control module and/or stylus of FIG. 2 to drive transmit electrodes of a sensor panel and/or stylus.

With reference to FIG. 4 a method of operation at the sensor panel control module 100 is described, regarding a transmit stage where drive signals are applied to transmit electrodes of the sensor panel 163. This example is described for the situation where Hadamard OFDM is used. However, this method is modified in examples where OFDM is used without Hadamard matrix transformation (by omitting the Hadamard matrix transform steps), or for other types of communication scheme, such as CDMA.

Orthogonal signals are selected 400 for the subcarriers. For example, the orthogonal drive signals are sinusoidal signals stored in memory 130 of the sensor panel control module 100 or are computed from a family of sinusoidal signals by applying values of parameters of the sinusoidal signals. One or more Hadamard matrices are accessed 402 from memory 130. For example, if there are more transmit electrodes than columns in the largest available Hadamard matrix, then two or more Hadamard matrices are used to ensure there is at least one unique Hadamard matrix column per transmit electrode. In some cases this means there will be some unused Hadamard matrix columns where the number of transmit electrodes is not an integer multiple of a number of columns of a Hadamard matrix.

For each transmit electrode the subcarriers are combined with phases of 0 or 180 degrees according to signs in a unique row of the accessed Hadamard matrix or matrices. This gives a drive signal for the particular transmit electrode. As mentioned above a column or a row of a Hadamard matrix is a list of +1 and −1 entries. The positive and negative signs from the row are applied to the subcarrier signals and then the subcarrier signals are aggregated such as by computing a sum as follows:

$$\text{signal at } Tx_n = \frac{1}{\sqrt{N}} \left( \sum_{i=1}^{N} subcarrier_i * HD_n(i) \right)$$

Where $Tx_n$ denotes a signal of duration T seconds on transmit electrode number n, and HD denotes the Hadamard matrix when $HD_n$ denotes row n of Hadamard matrix. N is the number of subcarriers. N may or may not be equal to number of transmit electrodes. The above equation is expressed in words as, a signal of duration T seconds on transmit electrode number n is equal to the ratio of 1 to the square root of the number of subcarriers, times the sum of the subcarrier signals in the duration T after applying the signs of a relevant row of the Hadamard matrix to the subcarrier signals. From the above expression, using sine waves of amplitude equal to 1 as subcarriers, it can be seen that the maximum value of the transmit signal at any transmit electrode during time T is equal to the square root of the total number of subcarriers N. Also, it is seen that the maximum value of the sum of transmitted signals at a receive electrode (omitting transmit channel and receive channel gains for explanation simplicity) is equal to the square root of the total number of subcarriers N, because of the cancellation of all but one of the subcarrier signals on each transmit electrode. The normalization by the square root of N at the transmitter is introduced to give an equivalent power and signal to noise ratio (SNR) as for a typical OFDM sensor panel where one subcarrier of amplitude 1 is transmitted at each transmit electrode.

The elements of a row of the Hadamard matrix are applied to combine 304 subcarriers for a transmit electrode, as part of a frequency domain to time domain conversion process. Any suitable conversion such as an inverse fast Fourier transform (IFFT), an inverse discrete Fourier transform (IDFT), an inverse cosine discrete transform (ICDT), wavelet transform or other suitable transform is used for converting the combined subcarrier signal from the frequency domain to the time domain.

The time domain signal is converted 406 to an analog signal using a digital to analog converter such as any well-known or future digital to analog converter. The analog drive signals are then applied 408 to the transmit electrodes.

Figure 5:
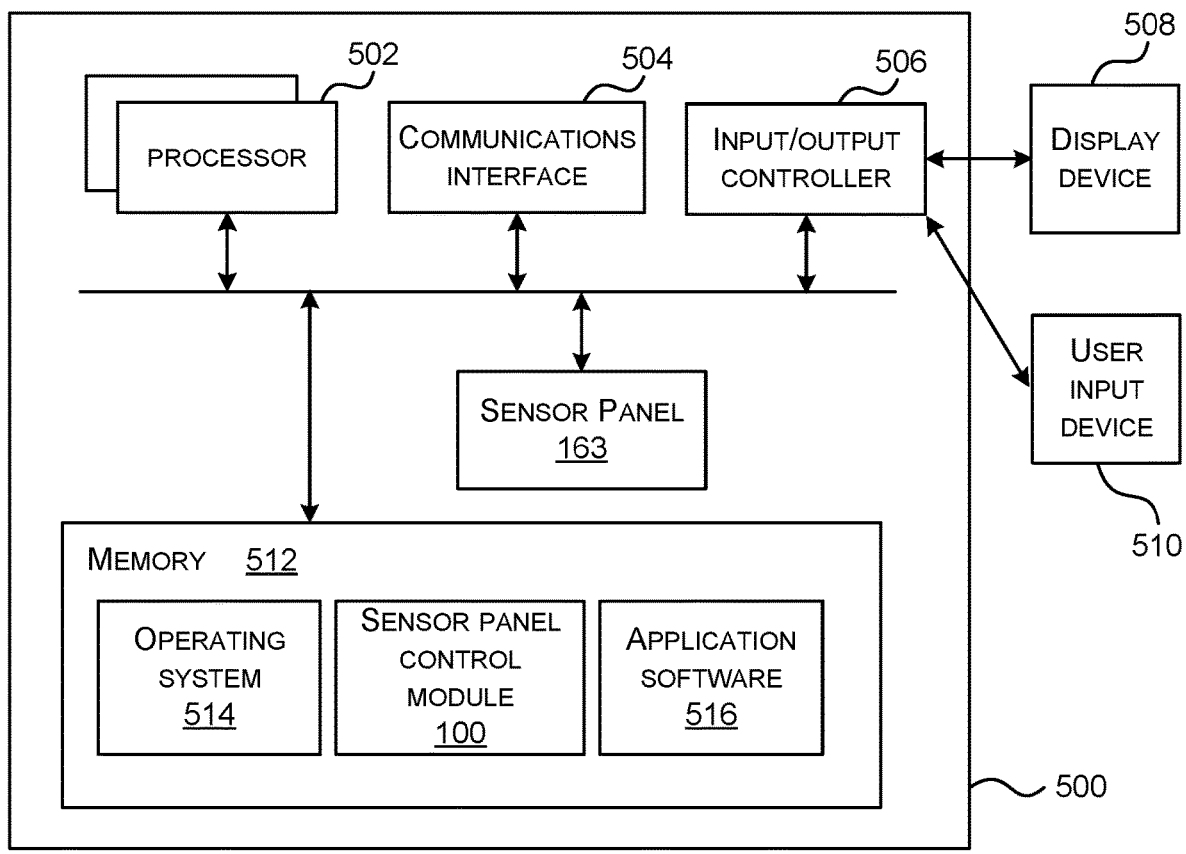
FIG. 5 illustrates an exemplary computing-based device in which embodiments of an electronic device with a sensor panel are implemented.

FIG. 5 illustrates various components of an exemplary computing-based device 500 which are implemented as any form of a computing and/or electronic device, and in which embodiments of an electronic device with a sensor panel controlled so as to reduce impulse noise are implemented in some examples.

Computing-based device 500 comprises one or more processors 502 which are microprocessors, controllers or any other suitable type of processors for processing computer executable instructions to control the operation of the device in order to operate a sensor panel and compute position of sensed touch on the sensor panel in a way which reduces impact of impulse noise and/or tone interferers. In some examples, for example where a system on a chip architecture is used, the processors 502 include one or more fixed function blocks (also referred to as accelerators) which implement a part of the method of any of FIGS. 3 and 4 in hardware (rather than software or firmware). Platform software comprising an operating system 514 or any other suitable platform software is provided at the computing-based device to enable application software 516 to be executed on the device. A sensor panel control module 100 operates to control sensor panel 163 as described with reference to FIGS. 1 to 4 above.

The computer executable instructions are provided using any computer-readable media that is accessible by computing based device 500. Computer-readable media includes, for example, computer storage media such as memory 512 and communications media. Computer storage media, such as memory 512, includes volatile and non-volatile, removable and non-removable media implemented in any method or technology for storage of information such as computer readable instructions, data structures, program modules or the like. Computer storage media includes, but is not limited to, random access memory (RAM), read only memory (ROM), erasable programmable read only memory (EPROM), electronic erasable programmable read only memory (EEPROM), flash memory or other memory technology, compact disc read only memory (CD-ROM), digital versatile disks (DVD) or other optical storage, magnetic cassettes, magnetic tape, magnetic disk storage or other magnetic storage devices, or any other non-transmission medium that is used to store information for access by a computing device. In contrast, communication media embody computer readable instructions, data structures, program modules, or the like in a modulated data signal, such as a carrier wave, or other transport mechanism. As defined herein, computer storage media does not include communication media. Therefore, a computer storage medium should not be interpreted to be a propagating signal per se. Although the computer storage media (memory 512) is shown within the computing-based device 500 it will be appreciated that the storage is, in some examples, distributed or located remotely and accessed via a network or other communication link (e.g. using communication interface 504).

The computing-based device 500 also comprises an input/output controller 506 arranged to output display information to a display device 508 which may be separate from or integral to the computing-based device 500. The display information may provide a graphical user interface. The input/output controller 506 is also arranged to receive and process input from one or more devices, such as a user input device 510 (e.g. a mouse, keyboard, camera, microphone or other sensor). In some examples the user input device 510 detects voice input, user gestures or other user actions and provides a natural user interface (NUI). This user input may be used to operate a graphical user interface or for other purposes. In an embodiment the display device 508 also acts as the user input device 510 if it is a touch sensitive display device. The input/output controller 506 outputs data to devices other than the display device in some examples, e.g. a locally connected printing device.

Any of the input/output controller 506, display device 508 and the user input device 510 may comprise NUI technology which enables a user to interact with the computing-based device in a natural manner, free from artificial constraints imposed by input devices such as mice, keyboards, remote controls and the like. Examples of NUI technology that are provided in some examples include but are not limited to those relying on voice and/or speech recognition, touch and/or stylus recognition (touch sensitive displays), gesture recognition both on screen and adjacent to the screen, air gestures, head and eye tracking, voice and speech, vision, touch, gestures, and machine intelligence. Other examples of NUI technology that are used in some examples include intention and goal understanding systems, motion gesture detection systems using depth cameras (such as stereoscopic camera systems, infrared camera systems, red green blue (rgb) camera systems and combinations of these), motion gesture detection using accelerometers/gyroscopes, facial recognition, three dimensional (3D) displays, head, eye and gaze tracking, immersive augmented reality and virtual reality systems and technologies for sensing brain activity using electric field sensing electrodes (electro encephalogram (EEG) and related methods).

More detail about the examples where Hadamard OFDM is used is now given.

A Hadamard matrix is a square matrix of possible order 4*k if exists for k>=1 and whose coefficients are either +1 or −1. Mostly used orders are 2^k, however Hadamard matrices of base order 12*k and 20*k are also known. A Hadamard matrix is an orthogonal matrix which is invertible. Since the coefficients of a Hadamard matrix are always +1 or −1 it is encodable as a single bit, thereby saving substantial storage space and matrix computation resources. Note that a Hadamard matrix is not the same as a Hadamard code, gold code, Kasami code or pseudo noise (PN) code. Because of the mathematical nature of the Hadamard matrix, for all except the first row and first column of the Hadamard matrix, the number of +1s and −1s in a row or column is equal.

Various examples described herein modify and extend orthogonal frequency division multiplexing in the context of sensor panel technology. Orthogonal frequency division multiplexing (OFDM) is a digital multi-carrier modulation method in which a single high rate data-stream is divided into multiple low rate carrier data-streams which have appropriately chosen frequencies so as to minimize interference between the carriers. OFDM is often used in sensor panel technology whereby many drive signals are needed to drive a large number of transmit electrodes of the sensor panel. The drive signals are to be orthogonal to one another so that it is possible to distinguish between them at a receiver applied to a receive electrode, despite receiving a sum of all transmitted signals at any receiver. In the context of OFDM in sensor panel technology there is typically one carrier frequency which contains many sub-carriers that are orthogonal to one another. The frequency orthogonality means that there is no cross-talk between the subcarriers by means of correlating the received signal with the known and expected frequency. If cross talk happens between the sub-carriers, then the ability of the sensor panel to accurately measure touch input positions is reduced. The OFDM orthogonality is achieved by selecting the subcarrier frequencies so they differ according to k/T Hertz, where k is an integer number and T denotes a receiving duration in seconds. The drive signals provided by the subcarriers are sinusoidal signals of different frequencies and therefore it is possible to use knowledge of the frequency of the drive signal to extract, from the signal received at a receive electrode, a signal transmitted by particular electrode and to perform amplitude and/or phase estimation. Typical OFDM solutions utilized for sensor panel technology are based on transmitting one subcarrier sinusoidal signal per transmitting electrode. In this way it is possible to distinguish and measure signals transmitted from a large number of transmitting electrodes at any receiver connected to a receiver electrode. For example, a distinguish and measurement process is performed separately for each receiving electrode to obtain the amplitude and phase of signals from different transmitting electrodes despite receiving a sum of all the transmitted signals. This is important for the case of sensor panel technology where user input is to be detected in real time and used to update graphical user interfaces or control computing devices or for other purposes without delay. In the case of sensor panel technology the number of transmitting electrodes to be considered may be as many as several tens or several hundreds since the pitch of the sensor panel may be as small as 5 millimeters or less. The number of receive electrodes is typically of the same order as the number of transmit electrodes but this is not essential. In the case of rectangular touch panels, typically the receive electrodes are parallel with a shorter axis of the rectangle. Usually the spacing of the electrodes in the horizontal and in the vertical direction is the same (although that is not essential), so the number of vertical and horizontal electrodes is different in the case of a rectangular sensor panel, so it is more efficient to have less receiving electrodes rather than less transmitting electrodes. The pitch of the sensor panel is a distance between two parallel adjacent transmitting electrodes and/or a distance between two parallel adjacent receiving electrodes. The sensing resolution of the sensor panel is a measure of the distance between two touch inputs on the sensor panel which can be reliably discriminated between by the sensor panel. Thus OFDM is well suited to sensor panel technology due to its ability to enable large numbers of orthogonal subcarriers in the case of a large number of transmitting electrodes. Having said that, OFDM suffers from a high peak to average ratio (PAPR) explained later in this document. Another problem with OFDM in the context of sensor panel technology is that OFDM is not robust to tone interferers. For example, a tone interferer detriments one of the subcarriers and in a pure OFDM scheme this means that one of the transmit electrodes performs poorly. The sensor panel is then unable to properly measure touch position in regions of the sensor panel where the particular transmit electrode is located.

A peak to average power ratio (PAPR), with respect to an OFDM signal, is the maximum power of a sample in a given OFDM transmit symbol divided by the average power of that OFDM symbol. In a multicarrier system such as an OFDM system the different sub-carriers are out of phase with each other but become coherent at times. When all the sub-carriers become coherent and achieve a maximum value simultaneously this will cause the output envelope of the OFDM carrier signal to suddenly shoot up causing a 'peak'. OFDM systems typically have a large number of independently modulated subcarriers so that the peak in the output envelope can be very high as compared to the average. In an example, OFDM PAPR is about 12 decibels (dB) for the situation where the drive signals are sinusoidal signals having 3 dB PAPR each. Thus OFDM systems are known to have a high peak-to-average power ratio (PAPR) when compared to single-carrier systems.

A high PAPR is known to be problematic for several reasons. It decreases the signal-to-quantization noise ratio (SQNR) of the analog-digital convertor (ADC) and digital-analog convertor (DAC) which reduces the ability of the OFDM communication system to perform efficiently. In addition a high PAPR degrades the efficiency of the power amplifier in the transmitter and receiver. When the efficiency of the power amplifier is degraded in this way it is possible for signal peaks to get into a non-linear region of the power amplifier causing signal distortion. This signal distortion introduces intermodulation among the subcarriers and out of band radiation. To ameliorate this, the power amplifiers may be operated with large power back-offs but this leads to very inefficient amplification and expensive transmitters. Thus, it is highly desirable to reduce the PAPR. Also, the large peaks in the output envelope cause saturation in power amplifiers, leading to intermodulation products among the subcarriers and disturbing out of band energy. It should be noted, that in the case of a typical OFDM implementation for sensor panel technology, the PAPR at the transmitting side is computed according to single subcarriers whilst the PAPR of the receiving side is computed according to a summation of all the transmitted subcarriers. Therefore the PAPR problem is less severe at the transmitter side and alleviating the PAPR issue at the receiver even by increasing the PAPR at transmitter side will provide significant benefits To reduce the PAPR, several techniques have been proposed including signal scrambling techniques (such as block coding with error correction) and signal distortion techniques such as envelope scaling or clipping. Signal scrambling techniques are highly complex and so not suited for use in the case of sensor panel technology as sensor panels are to be low cost, light weight, compact, and robust. Signal distortion techniques are disadvantageous, as by their nature, information in the transmitted signal is lost and so the communications ability is reduced. In the case of OFDM for sensor panel technology, the signal estimation and comparison quality is reduced. Thus when signal distortion techniques are used, such as clipping of the transmit signal, the accuracy of the sensed touch input position is reduced.

In some examples, the present technology uses a modified OFDM scheme for sensor panel technology. The technology introduces spreading over the orthogonal subcarriers to mitigate the impact of tone interferers. This is done in a manner which improves the PAPR of OFDM by a factor of the square root of N where N is the number of transmit electrodes. This is achieved without the need to apply signal distortion techniques to the transmit signal, such as clipping of the transmitted and/or received signal.

In some cases, spreading over the orthogonal subcarriers is done by using one or more Hadamard matrices to define the initial phase of a subcarrier and to spread the signals over the subcarriers at the transmit stage. Each transmit electrode transmits a signal computed by combining the subcarrier signals according to the Hadamard matrix, using a row of the Hadamard matrix for each transmit electrode. This is described in more detail below. A row of the Hadamard matrix can be thought of as being used to translate a signal in the frequency domain into the time domain. At the receive stage, for each receiving electrode separately, an inverse of the Hadamard matrix is applied to the received signal, using individual rows as for individual receive electrodes in a similar manner as at the transmit stage. The inverse Hadamard operation is done in the time domain, after analog to digital conversion of the received signal and after conversion from the frequency domain to the time domain. The inverse Hadamard matrix operation separates out parts of the received signal at a single receive electrode which result from different transmit electrodes.

At the transmit stage, each transmit electrode transmits a signal which is an aggregation of the subcarrier signals where the subcarrier signals are assigned an initial phase of 0 or 180 degrees according to a positive or negative sign. For a given transmit electrode, the positive or negative signs are obtained from a single row of the Hadamard matrix for the given transmit electrode. Because of the mathematical nature of the Hadamard matrix, for all except the first row and first column of the Hadamard matrix, the number of +1s and −1s in a row or column is equal. In this way, all subcarriers are transmitted on each transmit electrode. Thus all signals of all transmit electrodes are summed to a receive signal at each and every receive electrode. All subcarriers except one are summed with N/2 positive and N/2 negative phases. Therefore all subcarriers except one will cancel out in the case of no touch input at the sensor panel. The non-cancelled subcarrier appears at a receive electrode as a sinusoidal signal, so therefore a PAPR of 3 dB occurs for the situation where the drive signals are sinusoidal signals of 3 dB. In contrast, using standard OFDM will give a PAPR of 12 dB as mentioned above. Therefore, in the non-touch case the PAPR is reduced as compared with standard OFDM.

In the touch case, a PAPR which is dependent only on signal change is achieved; that is, the receive signal over all receive electrode is biased by one sine wave of an amplitude A compared to a bias by the sum of sine waves of the same amplitude A for each receive electrode, i.e. N*A in the maximum for a standard OFDM case as opposed to amplitude A in the maximum for the present technology. In the touch case the impact on PAPR is around five times lower than a standard OFDM touch panel in the case where the touch event causes a 20% change in the receive signal as compared with the received signal in the absence of a touch.

Thus in both the touch and non-touch cases the PAPR is reduced as compared with regular OFDM and there is no need to apply signal distortion techniques, such as clipping of the transmit signal.

As mentioned above, PAPR is reduced in the case that Hadamard OFDM is used as compared with using standard OFDM. This is now explained in more detail. Using the symbol Fn to denote the complex value per time domain to frequency domain converter tuned to subcarrier fn then:

$$Fn = Qn(Tx1 + Tx2 + \ldots TxN)$$

$$Fn = Qn(Tx1) + Qn(Tx2) + \ldots + Qn(TxN)$$

Where Qn is the output of the time domain to frequency domain converter tuned to subcarrier fn. The above expression is expressed in words as: the complex value output of the time domain to frequency domain converter tuned to subcarrier fn is equal to the sum of the complex values from that converter for each transmit electrode during time interval T.

In the non-touch case, due to self-cancellation, Fn is zero for all n except for n=1, when the complex value for subcarrier 1 is the square root of the number of subcarriers times one half of the time interval.

The measured/sensed value per transmit electrode is denoted as Sn. The measured/sensed value per transmit electrode is related to the inverse Hadamard matrix transformation of the associated complex values and this is formally expressed as:

$$[S1, S2, \ldots Sn] = [IHD] * [F1, F2, \ldots FN]$$

Which is expressed in words as, a measured value Sk which is assumed to result from a given transmit electrode k is equal to the sum of the complex values of the outputs of the time to frequency domain converters after application of the inverse Hadamard matrix transformation.

Therefore, in the non-touch case the absolute value of the measured value S is equal to the square root of the number of subcarriers multiplied by half the time interval.

In the case of coherent detection the maximum value of the measured value S is also equal to the square root of the number of transmit electrodes multiplied by half the time interval.

In the case of a touch input there are complex values at the outputs of the time domain to frequency domain converters which result from the touch input and these are denoted by the symbol a together with an integer from 1 to N to indicate which transmit electrode is being considered. Thus the Fn values are rewritten as follows:

$$Fn=Qn(a1Tx1+a2Tx2+ \ldots aNTxN)$$

$$Fn=Qn(a1Tx1)+Qn(a2Tx2)+ \ldots +Qn(aNTxN)$$

Where Qn is the output of the time domain to frequency domain converter tuned to subcarrier fn. The above expression is expressed in words as: the complex value output of the time domain to frequency domain converter tuned to subcarrier fn is equal to the sum of the complex values from that converter for each transmit electrode during time interval T.

Due to the properties of the Hadamard matrix, the absolute value of the measured value S is equal to the sum of the complex values which result from the touch input where those complex values have been multiplied by, the square root of the number of subcarriers multiplied by half the time interval.

The performance of the processes described with reference to FIGS. 3 and 4 as compared with average white noise is the same as a regular OFDM system where single tone sinusoidal signals with amplitude of one are sent at each transmit electrode separately.

In the case where a stylus is used, one of the rows of the Hadamard matrix is used for the stylus electrode and may be transmitted to the stylus using communication interface 170, 230. Therefore, the stylus electrode may be considered as one of transmitting electrodes.

For designs where the stylus or pen is sensed at periods when no other signals are transmitted and/or at frequency bands where no other signals are transmitted, the stylus or pen is arranged to transmit subcarriers combined using more than one Hadamard matrix row. This introduces flexibility in mitigation of frequency selective noise whilst still using the same receiver architecture. For example, where several subcarrier frequencies are over noised, it is possible to use several Hadamard matrix rows to combine the subcarrier signals such that the combination reduces or zeroes the energy transmitted on the over-noised frequencies.

At the receive side, for the non-touch case the outputs of the time domain to frequency domain converters is zero for all except one frequency, where the expected amplitude is [sqrt(N)*T/2] as mentioned above. After multiplication by the inverse Hadamard Matrix, all output amplitude values are (sqrt(N))*(T/2).

Suppose only one Tx electrode was touched with a reducing effect denoted by the symbol ro. For example for ro=20%, the calculated inverse Hadamard Matrix multiplication output is $$(sqrt(N)*(T/2))*(1-ro)=0.8*sqrt(N)*(T/2)$$

Continuing with the non-touch case, all but one of the time domain to frequency domain converters give amplitudes equal to [ro/sqrt(N)*(T/2)] and the remaining time domain to frequency domain converter's amplitude is $$[(N-1)/(sqrt(N)*(T/2))+(1-ro)/(sqrt(N)*(T/2))]=(sqrt(N)*(T/2))-ro/(sqrt(N)*(T/2)).$$

After inverse Hadamard Matrix multiplication, all values will be [sqrt(N)*(T/2)] except the touched one of:

$$[(sqrt(N)*(T/2))-ro*(sqrt(N)*(T/2))]=(sqrt(N)*(T/2))*(1-ro).$$

Alternatively or in addition to the other examples described herein, examples include any combination of the following:

An electronic device comprising:

a sensor panel comprising a plurality of receive electrodes configured to measure signals received from one or more transmit electrodes; and a sensor panel control module configured to:

receive signals from the plurality of receive electrodes in the presence of at least one tone interferer;

convert the received signals from a time domain into a frequency domain; and process the received signals in the frequency domain in order to mitigate the effect of the tone interferer.

The electronic device described above wherein the sensor panel control module is configured to process the received signals in the frequency domain by applying clipping, or blanking or clipping-with-blanking.

The electronic device described above wherein the signals are received in the presence of impulse noise, and wherein the sensor panel control module is configured to process the received signals in the time domain by applying clipping, or blanking or clipping-with-blanking.

The electronic device described above wherein the sensor panel control module uses an orthogonal frequency division multiplexing with Hadamard matrix transformation scheme to communicate with the sensor panel.

The electronic device described above wherein the sensor panel control module is configured to clip or blank the received signals by taking at least one sample of one of the received signals and, for each sample, reducing an amplitude of the sample or setting the amplitude of the sample to zero.

The electronic device described above wherein the sensor panel control module is configured to replace samples of the received signal which were clipped or blanked, with interpolated values.

The electronic device described above wherein the sensor panel control module is configured to apply a driving signal to each of the transmit electrodes, and to compute the driving signals using orthogonal frequency division multiplexing to obtain a plurality of orthogonal subcarrier signals, and configured to apply a Hadamard matrix transform to the orthogonal subcarrier signals to compute final signals for driving the transmit electrodes.

The electronic device described above wherein the sensor panel control module is configured, for each transmit electrode, to assign signs to the subcarrier signals according to one of the rows of a Hadamard matrix used in the Hadamard matrix transform.

The electronic device described above configured for use with a stylus, wherein the stylus incorporates one or more of the electrodes.

A sensor panel control module for controlling a sensor panel, the sensor panel control module comprising circuitry configured to:

receive signals from the plurality of receive electrodes in the presence of at least one tone interferer;

convert the received signals from a time domain into a frequency domain; and process the received signals in the frequency domain in order to mitigate the effect of the tone interferer.

A method of controlling a sensor panel comprising:

receiving signals from the plurality of receive electrodes in the presence of at least one tone interferer;

converting the received signals from a time domain into a frequency domain; and processing the received signals in the frequency domain in order to mitigate the effect of the tone interferer.

The method described above comprising processing the received signals in the frequency domain by applying clipping, or blanking or clipping-with-blanking.

The method described above comprising, receiving the signals in the presence of impulse noise, and wherein the sensor panel control module is configured to process the received signals in the time domain by applying clipping, or blanking or clipping-with-blanking.

The method described above comprising, using an orthogonal frequency division multiplexing with Hadamard matrix transformation scheme to communicate with the sensor panel.

The method described above comprising clipping or blanking the received signals by taking at least one sample of one of the received signals and, for each sample, reducing an amplitude of the sample or setting the amplitude of the sample to zero.

The method described above comprising replacing samples of the received signal which were clipped or blanked, with interpolated values.

The method described above comprising:

computing, using orthogonal frequency division multiplexing, a plurality of orthogonal subcarrier signals;

applying a Hadamard matrix transform to the orthogonal subcarrier signals to compute final signals;

applying the final signals to the transmit electrodes.

The method described above comprising, for each transmit electrode, assigning signs to the subcarrier signals according to one of the rows of a Hadamard matrix used in the Hadamard matrix transform.

The method described above comprising, for each transmit electrode, summing the subcarrier signals after the signs have been assigned.

The method described above comprising, storing the Hadamard matrix comprising a matrix of integers which are either positive or negative 1 and wherein for all except the first row and first column of the Hadamard matrix, the number of +1s and −1s in a row or column is equal.

The term 'computer' or 'computing-based device' is used herein to refer to any device with processing capability such that it executes instructions. Those skilled in the art will realize that such processing capabilities are incorporated into many different devices and therefore the terms 'computer' and 'computing-based device' each include personal computers (PCs), servers, mobile telephones (including smart phones), tablet computers, set-top boxes, media players, games consoles, personal digital assistants, wearable computers, and many other devices.

The methods described herein are performed, in some examples, by software in machine readable form on a tangible storage medium e.g. in the form of a computer program comprising computer program code means adapted to perform all the operations of one or more of the methods described herein when the program is run on a computer and where the computer program may be embodied on a computer readable medium. The software is suitable for execution on a parallel processor or a serial processor such that the method operations may be carried out in any suitable order, or simultaneously.

This acknowledges that software is a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions are optionally distributed across a network. For example, a remote computer is able to store an example of the process described as software. A local or terminal computer is able to access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a digital signal processor (DSP), programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The operations of the methods described herein may be carried out in any suitable order, or simultaneously where appropriate. Additionally, individual blocks may be deleted from any of the methods without departing from the scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

The invention claimed is:

1. An electronic device comprising:
a sensor panel comprising a plurality of receive electrodes configured to measure signals received from one or more transmit electrodes; and
a sensor panel control module configured to:
receive signals from the plurality of receive electrodes in a presence of at least one tone interferer;
process the received signals in a frequency domain by applying clipping, blanking or clipping-with-blanking in order to mitigate an effect of the at least one tone interferer based on a clipping threshold or a blanking threshold, wherein the clipping threshold and the blanking threshold used for a signal which is not zeroed by self-cancellation is computed as a constant bias value applied to an expected signal amplitude; and compute a location of an input on the sensor panel based at least on the processed received signals in the frequency domain.

2. The electronic device of claim 1 wherein the signals are received in a presence of impulse noise, and prior to converting the received signals from a time domain into the frequency domain, the sensor panel control module is configured to process the received signals in the time domain by applying clipping, or blanking or clipping-with-blanking.

3. The electronic device of claim 1 wherein the sensor panel control module uses an orthogonal frequency division multiplexing with Hadamard matrix transformation scheme to communicate with the sensor panel.

4. The electronic device of claim 3 wherein the sensor panel control module is configured to clip or blank the received signals by taking at least one sample of one of the received signals and, for each sample, reducing an amplitude of the sample.

5. The electronic device of claim 1 wherein the sensor panel control module is configured to clip or blank the received signals by taking at least one sample of one of the received signals and, for each sample, setting an amplitude of the sample to zero.

6. The electronic device of claim 1 wherein the sensor panel control module is configured to replace samples of the received signal which were clipped or blanked, with interpolated values.

7. The electronic device of claim 1 wherein the sensor panel control module is configured to apply a driving signal to each of the transmit electrodes, and to compute the driving signals using orthogonal frequency division multiplexing to obtain a plurality of orthogonal subcarrier signals, and configured to apply a Hadamard matrix transform to the orthogonal subcarrier signals to compute final signals for driving the transmit electrodes.

8. The electronic device of claim 1 configured for use with a stylus, wherein the computed location of the input is a location of the stylus on the sensor panel.

9. A sensor panel control module for controlling a sensor panel, the sensor panel control module comprising circuitry configured to:

receive signals from a plurality of receive electrodes in a presence of at least one tone interferer;

convert the received signals from a time domain into a frequency domain using one time domain to frequency domain converter correlated to each of the received signals;

process the received signals in the frequency domain by applying blanking or clipping-with-blanking in order to mitigate an effect of the at least one tone interferer based on a clipping threshold or a blanking threshold, wherein the clipping threshold and the blanking threshold used for a signal which is not zeroed by self-cancellation is computed as a constant bias value applied to an expected signal amplitude; and compute a location of an input on the sensor panel based at least on the processed received signals in the frequency domain.

10. A method of controlling a sensor panel comprising:

receiving signals from a plurality of receive electrodes in a presence of at least one tone interferer;

converting the received signals from a time domain into a frequency domain using one time domain to frequency domain converter correlated to each of the received signals;

processing the received signals in the frequency domain by applying clipping, blanking or clipping-with-blanking in order to mitigate an effect of the at least one tone interferer based on a clipping threshold or a blanking threshold, wherein the clipping threshold and the blanking threshold used for a signal which is not zeroed by self-cancellation is computed as a constant bias value applied to an expected signal amplitude; and computing a location of an input on the sensor panel based at least on the processed received signals in the frequency domain.

11. The method of claim 10 comprising, receiving the signals in a presence of impulse noise, and processing the received signals in the time domain by applying clipping, or blanking or clipping-with-blanking.

12. The method of claim 10 comprising, using an orthogonal frequency division multiplexing with Hadamard matrix transformation scheme to communicate with the sensor panel.

13. The method of claim 10 comprising clipping or blanking the received signals by taking at least one sample of one of the received signals and, for each sample, reducing an amplitude of the sample or setting the amplitude of the sample to zero.

14. The method of claim 10 comprising replacing samples of the received signal which were clipped or blanked, with interpolated values.

15. The method of claim 10 comprising:

computing, using orthogonal frequency division multiplexing, a plurality of orthogonal subcarrier signals; and applying a Hadamard matrix transform to the orthogonal subcarrier signals to compute final signals.

16. The method of claim 15 comprising, storing the Hadamard matrix comprising a matrix of integers which are either positive or negative 1 and wherein for all except a first row and first column of the Hadamard matrix, a number of +1s and −1s in a row or column is equal.

17. The method of claim 15 comprising, for each transmit electrode, assigning signs to the orthogonal subcarrier signals according to a row of a Hadamard matrix used in the Hadamard matrix transform.

18. The method of claim 17 comprising, for each transmit electrode, summing the orthogonal subcarrier signals after the signs have been assigned.

19. The sensor panel control module of claim 9, wherein the circuitry is further configured to use an orthogonal frequency division multiplexing with Hadamard matrix transformation scheme to communicate with the sensor panel.

20. The sensor panel control module of claim 9, wherein the sensor panel control module is configured to clip or blank the received signals by taking at least one sample of one of the received signals and, for each sample, reducing an amplitude of the sample or setting the amplitude of the sample to zero.

* * * * *